(12) United States Patent
Jeong

(10) Patent No.: US 11,763,868 B2
(45) Date of Patent: Sep. 19, 2023

(54) SUB-WORDLINE DRIVER

(71) Applicant: SK hynix Inc., Icheon-si (KR)

(72) Inventor: Jae Hong Jeong, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 17/671,536

(22) Filed: Feb. 14, 2022

(65) Prior Publication Data

US 2022/0172759 A1    Jun. 2, 2022

Related U.S. Application Data

(62) Division of application No. 16/995,972, filed on Aug. 18, 2020, now Pat. No. 11,289,140.

(30) Foreign Application Priority Data

Feb. 28, 2020    (KR) .................. 10-2020-0025389

(51) Int. Cl.
    *G11C 8/14*    (2006.01)
    *G11C 8/08*    (2006.01)

(52) U.S. Cl.
    CPC . *G11C 8/08* (2013.01); *G11C 8/14* (2013.01)

(58) Field of Classification Search
    CPC .............. G11C 8/08; G11C 8/14; G11C 5/063
    See application file for complete search history.

(56) References Cited

U.S. PATENT DOCUMENTS

| 6,049,499 A | 4/2000 | Sukegawa et al. |
| 6,118,722 A | 9/2000 | Jeon et al. |
| 9,318,175 B1 | 4/2016 | Chi |
| 9,583,152 B1 * | 2/2017 | Jeong ............... H01L 23/528 |
| 2006/0104146 A1 | 5/2006 | Lee |
| 2007/0008807 A1 | 1/2007 | Jeong |
| 2007/0133318 A1 | 6/2007 | Min et al. |
| 2008/0159054 A1 | 7/2008 | Lee et al. |
| 2009/0116304 A1 | 5/2009 | Kim et al. |

(Continued)

FOREIGN PATENT DOCUMENTS

| CN | 1153387 A | 7/1997 |
| CN | 102612715 A | 7/2012 |

(Continued)

OTHER PUBLICATIONS

First Notification of Office Action from China National Intellectual Property Administration for Application No. 202010841263.0, dated Apr. 28, 2023.

*Primary Examiner* — Khamdan N. Alrobaie

(57) ABSTRACT

A sub-wordline driver for a semiconductor memory device includes a plurality of first active regions spaced apart from each other by a predetermined distance in each of a first direction and a second direction within a first region and a main wordline formed to traverse the plurality of first active regions by extending in the first direction. The main wordline includes a first line formed to extend in the first direction, a second line formed to extend in the first direction, and configured to be spaced apart from the first line by a predetermined distance in the second direction, and a connection line configured to interconnect the first line and the second line in the second direction at an end portion of the first region.

14 Claims, 8 Drawing Sheets

(56) References Cited

U.S. PATENT DOCUMENTS

| | | | |
|---|---|---|---|
| 2010/0046313 A1* | 2/2010 | Lee | G11C 11/4085 |
| | | | 365/230.06 |
| 2011/0228624 A1 | 9/2011 | Kim et al. | |
| 2012/0195142 A1 | 8/2012 | Lee et al. | |
| 2013/0155801 A1* | 6/2013 | Yun | G11C 8/08 |
| | | | 365/230.06 |
| 2015/0117079 A1* | 4/2015 | Yun | G11C 5/02 |
| | | | 365/51 |
| 2021/0272613 A1 | 9/2021 | Jeong | |

FOREIGN PATENT DOCUMENTS

| | | | |
|---|---|---|---|
| CN | 103165174 A | 6/2013 | |
| CN | 109074834 A | 12/2018 | |
| KR | 1019970023435 A | 5/1997 | |
| KR | 10-1163045 B1 | 7/2017 | |

\* cited by examiner

SUB-WORDLINE DRIVER

CROSS-REFERENCE TO RELATED APPLICATION

This patent application is a divisional application of a U.S. patent application Ser. No. 16/995,972, filed on Aug. 18, 2020, which claims priority under 35 U.S.C. § 119(a), and the benefits of, Korean patent application No. 10-2020-0025389, filed on Feb. 28, 2020, which is hereby incorporated in its entirety by reference.

TECHNICAL FIELD

The technology and implementations disclosed in this patent document generally relate to a sub-wordline driver, and more particularly to a sub-wordline driver for a semiconductor memory device.

BACKGROUND

A semiconductor device may write or read data into or from memory cells that are coupled to word lines and bit lines. The memory cells that are coupled to the word lines may form a single row such that the memory cells operate in response to a voltage applied to the word lines.

As the number of high-capacity semiconductor devices increases, resistances of lines (or wires) also increases in memory cells that are arranged in a single row. Consequently, there is a need to reduce the length of word lines coupled to memory cells in order to lower resistances and optimize for minimum delay times. In one proposed solution, an improved method of arranging a word line for selecting a row of a memory cell array includes dividing the line into a plurality of sections. That is, a hierarchical word-line driving method has been widely used to form a plurality of sub-wordlines by dividing the word line into a plurality of sections each having a suitable, shorter length.

SUMMARY

Various embodiments of the disclosed technology relate to an improved memory device structure having a sub-wordline driver with a reduced area or footprint that allows the division of a sub-wordline into shorter segments to decrease or minimize delay times.

In accordance with an embodiment of the disclosed technology, a sub-wordline driver may include a selection controller configured to selectively output any one of a first-group wordline selection signal and a second-group wordline selection signal in response to a selection signal and a wordline drive signal, and a plurality of driving circuits configured to selectively output any one of a plurality of sub-wordline drive signals in response to a main wordline drive signal, the wordline drive signal, the first-group wordline selection signal, and the second-group wordline selection signal.

In accordance with another embodiment of the disclosed technology, a sub-wordline driver may include a plurality of first active regions spaced apart from each other by a predetermined distance in each of a first direction and a second direction within a first region, and a main wordline formed to traverse the plurality of first active regions by extending in the first direction. The main wordline may include a first line formed to extend in the first direction, a second line formed to extend in the first direction, and configured to be spaced apart from the first line by a predetermined distance in the second direction, and a connection line configured to interconnect the first line and the second line in the second direction at an end portion of the first region.

In accordance with still another embodiment of the disclosed technology, a sub-wordline driver may include a plurality of first and second active regions spaced apart from each other by a predetermined distance in each of a first direction and a second direction within a first region, a plurality of third and fourth active regions spaced apart from each other by a predetermined distance in each of the first direction and the second direction within a second region contiguous to the first region, a first main wordline formed to extend in the first direction, and configured to traverse the plurality of first active regions and the plurality of third active regions, and a second main wordline formed to extend in the first direction, and configured to traverse the plurality of second active regions and the plurality of fourth active regions. Each of the first main wordline and the second main wordline may include a first line formed to extend in the first direction, and a second line formed to extend in the first direction, and configured to be spaced apart from the first line by a predetermined distance in the second direction, wherein a connection line is configured to interconnect the first line and the second line of the first main wordline in the second direction at an end portion of the second region, and wherein the connection line is configured to interconnect the first line and the second line of the second main wordline in the second direction at an end portion of the first region.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
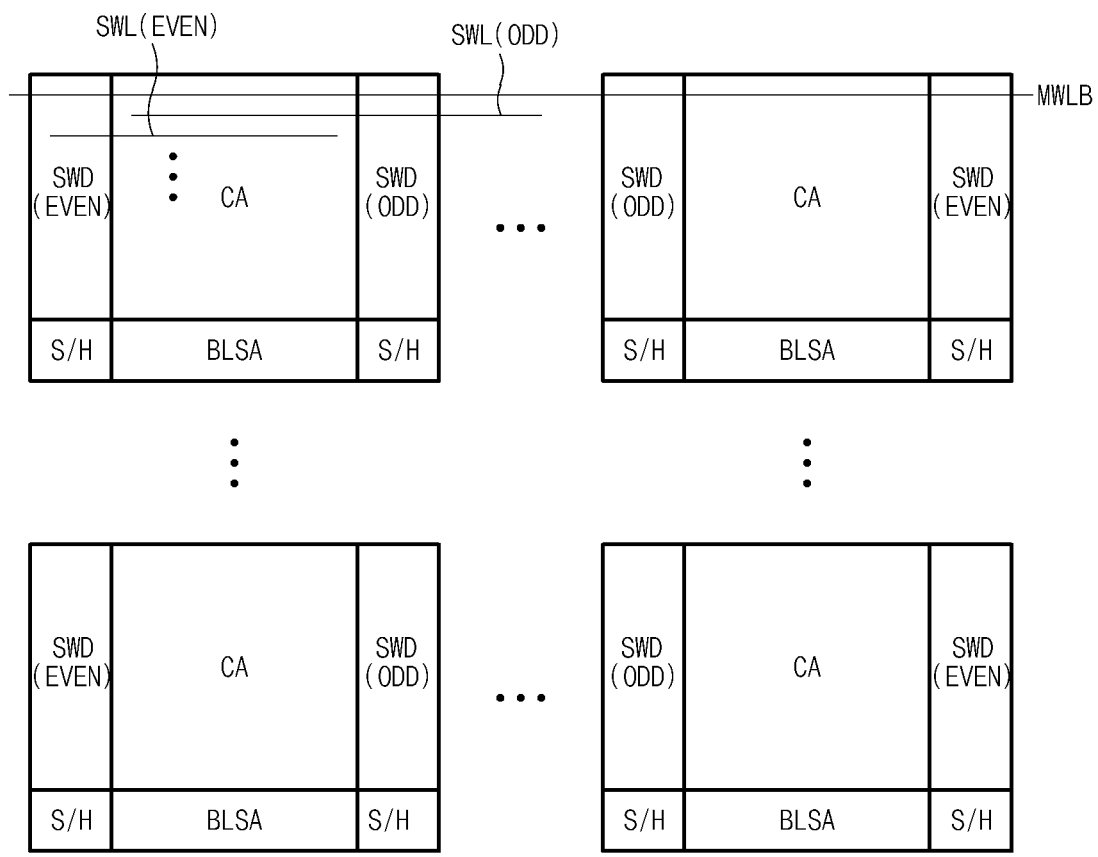
FIG. 1 is a block diagram illustrating a schematic of cell arrays with a sub-wordline driver, and other elements, in a semiconductor device according to embodiments of the disclosure.

This patent document describes implementations and examples of a sub-wordline driver that substantially addresses one or more issues arising from limitations and disadvantages of the related art. Some implementations or embodiments of the disclosed technology suggest a sub-wordline driver for improving a semiconductor memory device structure such that the region occupied by the sub-wordline driver can be minimized in size. In recognition of the issues above, the disclosed technology provides various implementations of a sub-wordline driver that is configured in a manner that the area or footprint occupied by the sub-wordline driver can be minimized in size.

Reference will now be made in detail to embodiments of the disclosed technology, examples of which are illustrated in the accompanying drawings. Wherever possible, the same reference numbers are used throughout the drawings to refer to the same or like portions.

Advantages and features of the disclosed technology and methods of achieving the advantages and features of the disclosed technology will be clearly understood from embodiments described hereinafter in conjunction with the accompanying drawings. However, the present disclosure is not limited to the following embodiments and may be realized in various different ways or forms. Exemplary embodiments are provided only to fully convey the disclosed technology to a person having ordinary skill in the art to which the disclosed technology pertains. In the drawings, the sizes or relative sizes of layers and regions may be exaggerated for clarity of description.

The terminology used herein is for the purpose of describing particular embodiments only and is not intended to be limiting of the disclosed technology. As used herein, the singular forms are intended to include the plural forms as well, unless the context clearly indicates otherwise. It will be further understood that the terms "comprises", "includes", "including", and/or "comprising," when used in this specification, specify the presence of stated constituent elements, steps, operations, and/or components, but do not preclude the presence or addition of one or more other constituent elements, steps, operations, and/or components. The term "and/or" may include a combination of a plurality of items or any one of a plurality of items. The same reference numbers will be used throughout this specification to refer to the same or like constituent elements.

In descriptions of the disclosed technology, the terms "first", "second" and the like may be used to describe various elements, components, and/or sections, but the elements, components, and/or sections are not limited by these terms. These terms may be used to distinguish one component, one constituent element, or one section from another component, another constituent element, or another section. Therefore, a first element, a first constituent element, or a first section may also be called a second element, a second constituent element, or a second section without departing from the scope of the disclosed technology.

When an element or a layer is referred to as being "on" another element or another layer, it can be directly on the element or the layer, or one or more intervening elements or layers may also be present. In contrast, when an element or a layer is referred to as being "directly on" another element or another layer, it means that no intervening elements or layers are present. The term "and/or" may include a combination of a plurality of items or any one of a plurality of items.

Spatially relative terms such as "below," "beneath," "lower," "above," or "upper" may be used herein to describe one element's relationship to another element as illustrated in the drawings. It will be understood that spatially relative terms are intended to encompass different orientations of the elements during the use or operation of the elements in addition to the orientation depicted in the drawings. Wherever possible, the same reference numbers will be used throughout the specification to refer to the same or like elements.

Furthermore, the embodiments described herein may be understood with reference to cross-sectional views and plan views, that is, ideal exemplary diagrams of the disclosed technology. Accordingly, forms of the exemplary diagrams may be changed by fabrication technology and/or tolerances. Accordingly, the embodiments of the disclosed technology are not limited to the illustrated specific forms, but may include changes in the forms according to a fabrication process. Accordingly, regions illustrated in the drawings have schematic attributes, and the shapes of the illustrated regions are intended to illustrate a specific form of a region of the element (or device) but are not intended to limit the scope of the disclosure.

FIG. 1 is a block diagram illustrating a schematic of cell arrays with a sub-wordline driver, and other elements, in a semiconductor device according to embodiments of the disclosure.

Referring to FIG. 1, in an embodiment, a semiconductor device may include at least one cell array, and a circuit for controlling the cell array that includes a main wordline. FIG. 1 illustrates a plurality of cell arrays (CA). Each cell array (CA) may include at least one bit-line sense amplifier (BLSA), at least one sub-wordline driver (SWD), and at least one sub hole (S/H).

Each cell array (CA) may include a plurality of memory cells, for storing data, that are formed into an array shape. The cell array (CA) may include a plurality of sub-wordlines (SWL). The sub-wordlines (SWL) may be sequentially and consecutively arranged over the cell array (CA). A main wordline may be coupled to multiple sub-wordlines, and each sub-word line may be coupled to multiple memory cells.

In a semiconductor device, a word line may serve as a conductive line (also called a conducting line) through which a gate voltage, needed to drive one or more cell transistors of a memory cell, is transferred. The cell transistors may operate in response to a potential state of the word line, such that data can be written in or read from the memory cell by the cell transistors.

Therefore, as a chip size and memory capacity of a chip increases, a line delay caused by such word lines may be recognized as one of the most important delay factors that limit the operation speed of the semiconductor device. In order to minimize the line delay of such word lines, improved methods for dividing a long word line into a plurality of sub-wordlines, and for driving each sub-wordline using either a local driver or a repeater, have recently been developed. In the present disclosure, the local driver will hereinafter be referred to as a sub-wordline driver (SWD) for convenience of description.

The sub-wordline driver (SWD) may selectively drive one or more sub-wordlines in response to a main wordline drive signal (MWLB). In this case, the main wordline drive signal (MWLB) may denote a memory cell drive signal that is transmitted through a main wordline.

In FIG. 1, a sub-wordline driver (SWD) may be divided into an even sub-wordline driver circuit SWD (EVEN) disposed along one side of a cell array (CA), and an odd sub-wordline driver circuit SWD (ODD) disposed along the opposite side with respect to the cell array (CA). The even sub-wordline driver circuit SWD (EVEN) may drive one or more even sub-wordlines SWL (EVEN), and the odd sub-wordline driver circuit SWD (ODD) may drive one or more odd sub-wordlines SWL (ODD).

A sense-amplifier (BLSA) may sense and amplify cell data of the associated cell array (CA). The sense-amplifier may be arranged along another side of the cell array (CA). Sub-holes (S/H) may be located at intersection regions where the sense-amplifier (BLSA) meets the even and odd sub-wordline driver circuits.

Figure 2:
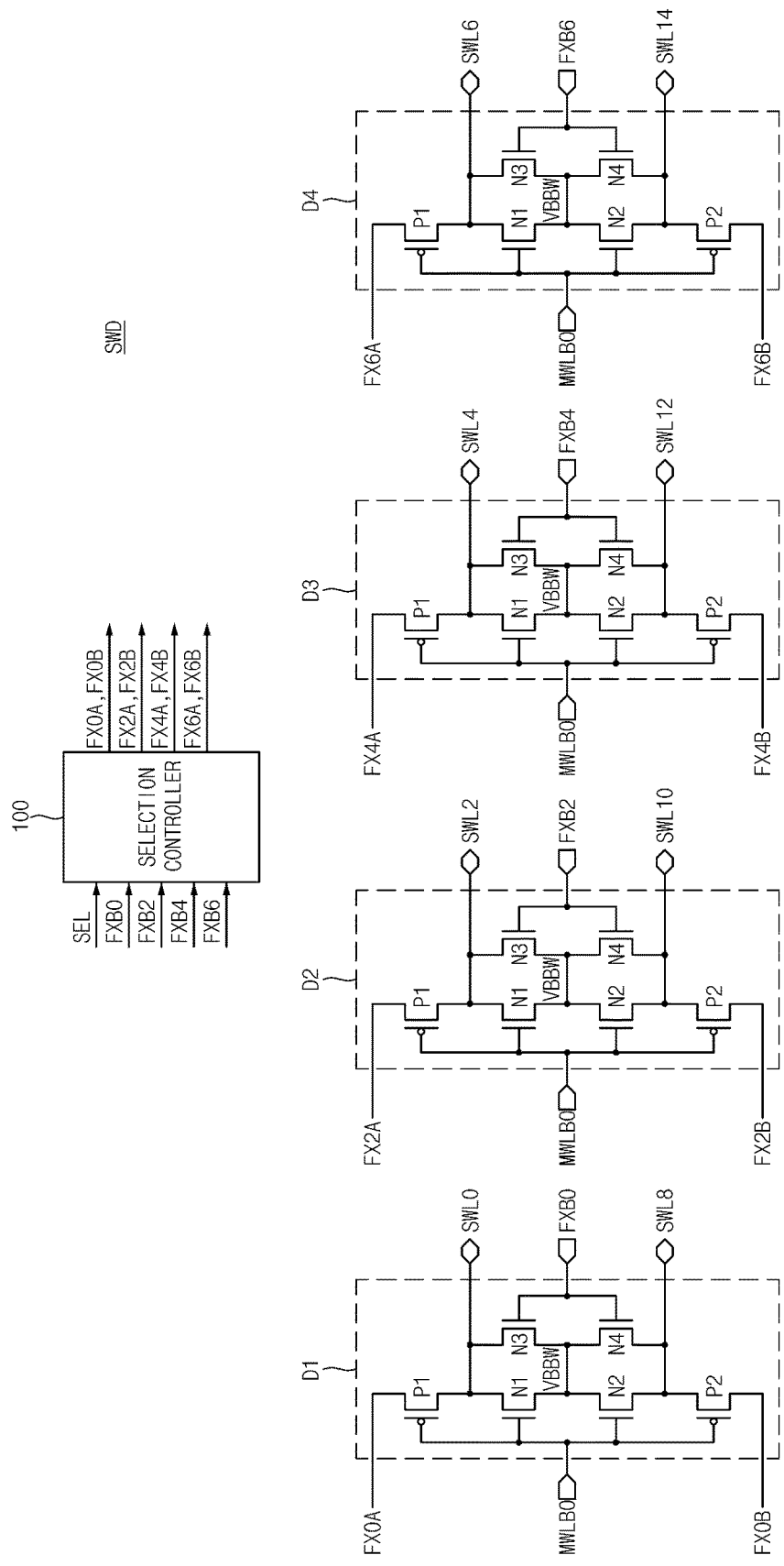
FIG. 2 illustrates an example of a sub-wordline driver of FIG. 1 according to an embodiment of the disclosure.

FIG. 2 illustrates an example of a sub-wordline driver (SWD) of FIG. 1 according to an embodiment of the disclosure. The sub-wordline driver (SWD) depicted in FIG. 2 will hereinafter be described using an even sub-wordline driver circuit SWD (EVEN) from FIG. 1 for convenience of description. It will be understood by those of skill in the art that an odd sub-wordline driver circuit SWD (ODD) has a substantially similar structure.

Referring to FIG. 2, the sub-wordline driver (SWD) may include a selection controller 100 and a plurality of driving circuits D1~D4.

In an example, the selection controller 100 may generate wordline selection signals FX0A, FX0B, FX2A, FX2B, FX4A, FX4B, FX6A, and FX6B in response to a selection signal (SEL) and wordline drive signals FXB0, FXB2, FXB4, and FXB6.

The driving circuits D1~D4 may respectively output sub-wordline drive signals SWL0 and SWL8; SWL2 and SWL10; SWL4 and SWL12; and SWL6 and SWL14 in response to a main wordline drive signal MWLB0, wordline selection signals FX0A, FX0B, FX2A, FX2B, FX4A, FX4B, FX6A, and FX6B, and wordline drive signals FXB0, FXB2, FXB4, and FXB6.

Other than the input/output (I/O) wordline drive, sub-wordline drive and selection signals, the elements of driving circuits D1~D4 may be identical in structure and arrangement with each other. Therefore, for convenience of description and better understanding of the disclosed technology, a detailed structure of only a first-stage driving circuit D1 from among the plurality of driving circuits D1~D4, will hereinafter be described with reference to FIG. 2.

The driving circuit D1 may include a plurality of PMOS transistors P1 and P2 and a plurality of NMOS transistors N1~N4. The PMOS transistors P1 and P2 and the NMOS transistors N1 and N2 may receive the main wordline drive signal (MWLB0) through a common gate terminal. The NMOS transistors N3 and N4 may receive a wordline drive signal (FXB0) through a common gate terminal.

The PMOS transistor P1 and the NMOS transistor N1 may be coupled in series between an input terminal of the wordline selection signal (FX0A) and an input terminal of a back-bias voltage (VBBW) (or a ground voltage VSS or a back-bias voltage VBB). The PMOS transistor P1 and the NMOS transistor N1 may output a sub-wordline drive signal (SWL0) through a common drain terminal.

The PMOS transistor P2 and the NMOS transistor N2 may be coupled in series between an input terminal of a wordline selection signal (FX0B) and an input terminal of a back-bias voltage VBBW (or a ground voltage VSS or a back-bias voltage VBB). The PMOS transistor P2 and the NMOS transistor N2 may output a sub-wordline drive signal (SWL8) through a common drain terminal.

The NMOS transistors N3 and N4 may be coupled in series between an output terminal of a sub-word line drive signal (SWL0) and an output terminal of a sub-wordline drive signal (SWL8). The NMOS transistors N3 and N4 may receive the back-bias voltage VBBW through a common connection terminal.

Referring back to FIG. 1, the sub-wordline driver (SWD) may include the even sub-wordline driver circuit SWD (EVEN) and the odd sub-wordline driver circuit SWD (ODD). Four even wordline selection signals FX0, FX2, FX4, and FX6 corresponding to the even sub-wordline driver circuit SWD (EVEN) may be applied to the sub-wordline driver (SWD), and four odd wordline selection signals FX1, FX3, FX5, and FX7 corresponding to the odd sub-wordline driver circuit SWD (ODD) may also be applied to the sub-wordline driver (SWD). Therefore, a sub-wordline driver (SWD) may receive a total of 8 wordline selection signals FX0~FX7 in response to a single main wordline drive signal (MWLB0), such that all of 8 sub-wordline drive signals SWL0~SWL7 can be driven.

As the sub-wordline driver (SWD) is gradually reduced in size, a regional gain may gradually increase, so it is preferable that a sub-wordline driver (SWD) is minimized in size when used in a semiconductor device application. For example, the sub-wordline drivers (SWD) may be disposed in accordance with the pitch of sub-wordlines. However, as semiconductor memory devices are increasingly highly integrated, the pitch of sub-wordlines may be increasingly reduced, making it difficult to arrange sub-wordline drivers based on sub-wordline pitch alone without further structural changes.

Therefore, the sub-wordline driver (SWD) according to embodiments of the disclosed technology may be designed to drive multiple sub-wordlines by classifying wordline selection signals into first-group wordline selection signals FX0A, FX2A, FX4A, and FX6A and second-group wordline selection signals FX0B, FX2B, FX4B, and FX6B, and by selecting the first-group wordline selection signals FX0A, FX2A, FX4A, and FX6A or the second-group wordline selection signals FX0B, FX2B, FX4B, and FX6B in response to the selection signal (SEL).

In this case, sub-wordline drivers (SWD) according to embodiments of the disclosed technology may output eight even sub-wordline drive signals SWL0, SWL2, SWL4, SWL6, SWL8, SWL10, SWL12, and SWL14 and eight odd sub-wordline drive signals SWL1, SWL3, SWL5, SWL7, SWL9, SWL11, SWL13, and SWL15 in response to a single main wordline drive signal (MWLB0), for a total of 16 sub-wordline drive signals SWL0~SWL15.

As a result, the sub-wordline driver (SWD) according to embodiments of the disclosed technology can be disposed in a smaller area or region of a cell array, while capable of processing more signals to output more sub-wordline drive signals SWL0~SWL15 as compared to other sub-wordline drivers known in the art. In other words, for the same number of sub-wordline drive signals, the sub-wordline driver (SWD) according to embodiments of the disclosure can reduce the number of main wordline drive signals (MWLB) within in a limited region such as a cell array as compared to the general sub-wordline drivers.

As the number of main wordline drive signals (MWLB) is reduced, a line width of the main wordline drive signals (MWLB) may increase. As a result, a transmission (Tx) timing point of each main wordline drive signal (MWLB) can be improved, and at the same time, the probability of disconnection caused by defects in fabricating a thinner main word line can be reduced. In addition, as semiconductor memory devices have been developed to have a higher degree of integration, it has become more difficult for a row decoder to be arranged at a desired pitch. However, the sub-wordline driver according to embodiments of the disclosure can reduce the number of row decoders designed to generate wordline drive signals, thereby allowing the row decoders can be arranged at a smaller pitch.

Figure 3:
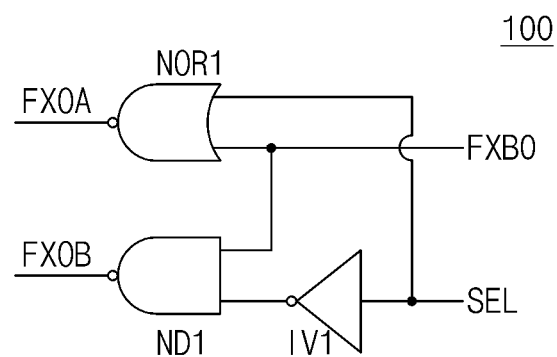
FIG. 3 is a detailed circuit diagram illustrating an example of a selection controller illustrated in FIG. 2 according to an embodiment of the disclosure.

FIG. 3 is a detailed circuit diagram illustrating an example of the selection controller illustrated in FIG. 2 according to an embodiment of the disclosure. For convenience of explanation, the selection controller depicted in FIGS. 2 and 3 are described with respect to an even sub-wordline driver circuit SWD (EVEN) from FIG. 1. It will be understood by those of skill in the art that a selection controller for an odd sub-wordline driver circuit SWD (ODD) has a substantially similar structure.

Referring to FIG. 3, the selection controller 100 may select the first-group wordline selection signals FX0A, FX2A, FX4A, and FX6A or the second-group wordline selection signals FX0B, FX2B, FX4B, and FX6B in response to the selection signal (SEL) and wordline drive signals FXB0, FXB2, FXB4, and FXB6.

The sub-wordline driver SWD may have four selection controllers 100, one for each driving circuit D1~D4 shown in FIG. 2. However, for convenience of description and better understanding of the disclosed technology, a detailed structure of only one selection controller 100 corresponding to the first-stage driving circuit D1 from among the plurality of drivers D1~D4 will hereinafter be described with reference to FIG. 3.

The selection controller 100 may include a NOR gate NOR1, a NAND gate ND1, and an inverter IV1. In this case, the NOR gate NOR1 may perform a NOR operation between the selection signal (SEL) and the wordline drive signal (FXB0), such that the NOR gate NOR1 may output the first-group wordline selection signal (FX0A). The NAND gate ND1 may perform a NAND operation between the wordline drive signal (FXB0) and the selection signal (SEL) inverted by the inverter IV1, such that the NAND gate ND1 may output the second-group wordline selection signal (FX0B).

Operations of the sub-wordline driver (SWD) including the selection controller 100 shown in FIG. 3 will hereinafter be described with reference to the following Table 1.

TABLE 1

|  |  | FXB0 | |
| --- | --- | --- | --- |
|  | FX0A | L | H |
| SEL | L | H | 0 |
|  | H | 0 | 0 |

In Table 1, when the selection signal (SEL) is at a logic low level (L) and the wordline drive signal (FXB0) is at a logic low level (L), the selection controller 100 may output the wordline selection signal (FX0A) at a logic high level (H).

TABLE 2

|  |  | FXB0 | |
| --- | --- | --- | --- |
|  | FX0B | L | H |
| SEL | L | 0 | 0 |
|  | H | H | 0 |

In Table 2, when the selection signal (SEL) is at a logic high level (H) and the wordline drive signal (FXB0) is at a logic low level (L), the selection controller 100 may output the wordline selection signal (FX0B) at a logic high level (H).

That is, when the selection signal (SEL) is at a logic low level (L), the selection controller 100 may output the wordline selection signal (FX0A) at a logic high level (H). When the selection signal is at a logic high level (H), the selection controller 100 may output the wordline selection signal (FX0B) at a logic high level (H). In other words, when the selection signal (SEL) is at a logic low level (L), the selection controller 100 may activate the first-group wordline selection signal (FX0A). When the selection signal (SEL) is at a logic high level (H), the selection controller 100 may activate the second-group wordline selection signal (FX0B).

TABLE 3

|  |  |  | FXB0 | |
| --- | --- | --- | --- | --- |
|  |  | SWL0 | 0 | 1 |
| SEL L | MWLB0 | 0 | H | 0 |
|  |  | 1 | 0 | 0 |
| SEL H |  | 0 | 0 | 0 |
|  |  | 1 | 0 | 0 |

In Table 3, it is assumed that the selection signal (SEL) is at a logic low level (L) such that the wordline selection signal (FX0A) can be output at a logic high level (H). In addition, it is also assumed that the main wordline drive signal (MWLB0) is at a logic low level (L). Thus, in the driving circuit D1 of FIG. 2, the NMOS transistors N1 and N2 may be turned off and the PMOS transistor P1 may be turned on. As a result, the sub-wordline drive signal (SWL0) may be activated and driven.

TABLE 4

|  |  |  | FXB0 | |
| --- | --- | --- | --- | --- |
|  |  | SWL0 | 0 | 1 |
| SEL L | MWLB0 | 0 | 0 | 0 |
|  |  | 1 | 0 | 0 |
| SEL H |  | 0 | H | 0 |
|  |  | 1 | 0 | 0 |

In Table 4, it is assumed that the selection signal (SEL) is at a logic high level (H) such that the wordline selection signal (FX0B) can be output at a logic high level (H). In addition, it is also assumed that the main wordline drive signal (MWLB0) is at a logic low level (L).

Thus, in the driving circuit D1 of FIG. 2, the NMOS transistors N1 and N2 may be turned off and the PMOS transistor P2 may be turned on. As a result, the sub-wordline drive signal (SWL8) may be activated and driven.

In accordance with embodiments of the disclosed technology, a selection controller may be arranged in a sub-hole region (S/H) as illustrated in FIG. 1. For example, the sub-hole region (S/H) may include a selection controller 100, a main word line driver (not shown) for generating the main wordline drive signal (MWLB0), a wordline boosting driver (not shown) for transmitting a boosting signal to the sub-wordline driver (SWD), a sub-hole control circuit (not shown) for controlling circuits formed in the sub-hole region (S/H), and the like. In this case, the boosting signal may denote a signal having a predetermined voltage level (generally, a voltage (VPP) higher in level than a memory cell voltage VCORE) in response to address information used to select one or more sub-wordlines.

Figure 4:
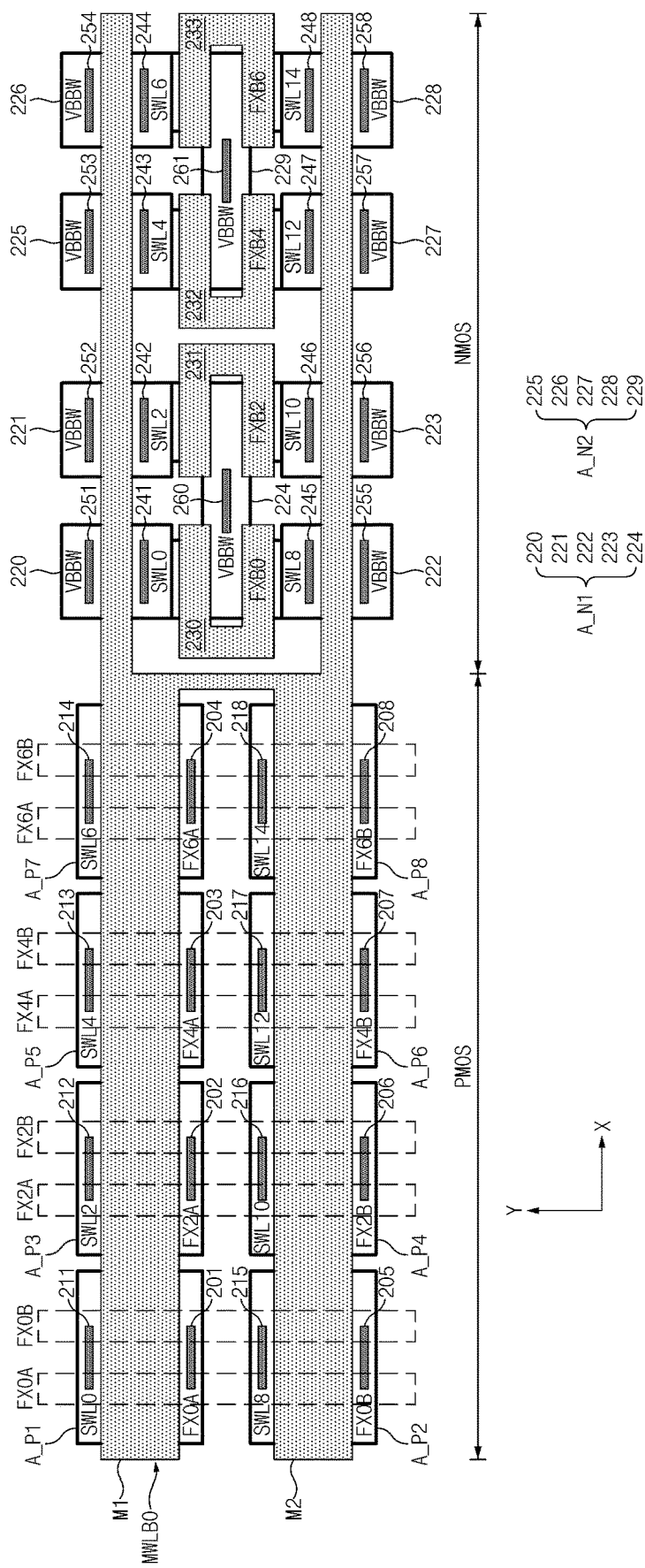
FIG. 4 is a schematic diagram illustrating a layout structure of a sub-wordline driver portion in FIG. 2 according to an embodiment of the disclosure.

FIG. 4 is a schematic diagram illustrating a layout structure of the sub-wordline driver (SWD) portion in FIG. 2 according to an embodiment of the disclosure. The sub-wordline driver (SWD) depicted in FIG. 4 will hereinafter be described using an even sub-wordline driver circuit SWD (EVEN) from FIG. 1 for convenience of description. It will be understood by those of skill in the art that an odd sub-wordline driver circuit SWD (ODD) has a substantially similar structure.

Referring to FIG. 4, an even sub-wordline driver circuit SWD (EVEN) may be classified into a PMOS region and an NMOS region. The PMOS region may correspond to the PMOS transistors P1 and P2 shown in FIG. 2, and the NMOS region may correspond to the NMOS transistors N1~N4 shown in FIG. 2.

A plurality of active regions A_P1~A_P8 may be disposed in the PMOS region, and a plurality of active regions A_N1 and A_N2 may be disposed in the NMOS region. In the layout structure, each of the active regions A_P1~A_P8 contained in the PMOS region may be formed in a rectilinear shape. The active regions A_P1~A_P8 contained in the PMOS region may be spaced apart from each other by a predetermined distance, not only in an X-axis direction, but also in a Y-axis direction. The X-axis direction and the Y-axis direction may be orthogonal to each other. The active regions A_N1 and A_N2 contained in the NMOS region may be formed by sub-active regions into a letter "H" shape, with each active region having a central sub-active region that couples the sub-active regions together.

The main wordline drive signal (MWLB0) line extending in the X-axis direction may be disposed over the active regions A_P1~A_P8 of the PMOS region and the active regions A_N1 and A_N2 of the NMOS region. In the following description, the above-referenced main wordline drive signal (MWLB0) line will hereinafter be referred to as a main wordline (MWLB0) for convenience of description.

In the PMOS region, the main wordline (MWLB0) may be divided into two lines M1 and M2 that are spaced apart from each other by a predetermined distance in the Y-axis direction. Lines M1 and M2 extend in the X-axis direction, and may be coupled to each other in the Y-axis direction in the area or region between the PMOS region and the NMOS region. A line width of the main wordline (MWLB0) in the PMOS region may be different from a line width of the main wordline (MWLB0) in the NMOS region. For example, in the main wordline (MWLB0), a line width of portions of lines M1 or M2 formed to pass over the active regions A_P1~A_P8 of the PMOS region may be larger than a line width of the remaining portions that pass over the active regions A_N1 and A_N2 of the NMOS region.

In the main wordline (MWLB0), the portions of lines M1 and M2 that overlap with the active regions A_P1~A_P8 and A_N1~A_N2 may serve as a gate through which the sub-wordline driver (SWD) receives the main wordline drive signal (MWLB0).

Lines through which the wordline selection signals FX0A, FX2A, FX4A, FX6A, FX0B, FX2B, FX4B, and FX6B are received may be spaced apart from each other by a predetermined distance in the X-axis direction. Lines through which the wordline selection signals FX0A, FX2A, FX4A, FX6A, FX0B, FX2B, FX4B, and FX6B are received may be disposed over the active regions A_P1~A_P8 by extending in the Y-axis direction.

In the PMOS active region, pairs of wordlines that carry wordline selection signals FX0A, FX2A, FX4A, FX6A, FX0B, FX2B, FX4B, and FX6B may be formed to pass over the active regions A_P1~A_P8. In the following description, the above-referenced wordlines will hereinafter be referred to as wordline selection signals for convenience of description. In more detail, a pair of the first-group wordline selection signal FX0A and the second-group wordline selection signal FX0B may be disposed to pass over the active regions A_P1 and A_P2, which are contiguous or adjacent to each other in the Y-axis direction. A pair of the first-group wordline selection signal FX2A and the second-group wordline selection signal FX2B may be disposed to pass over the active regions A_P3 and A_P4, which are contiguous or adjacent to each other in the Y-axis direction. A pair of the first-group wordline selection signal FX4A and the second-group wordline selection signal FX4B may be disposed to pass over the active regions A_P5 and A_P6, which are contiguous or adjacent to each other in the Y-axis direction. A pair of the first-group wordline selection signal FX6A and the second-group wordline selection signal FX6B may be disposed to pass over the active regions A_P7 and A_P8, which are contiguous or adjacent to each other in the Y-axis direction.

In the active regions A_P1~A_P8 of the PMOS region, metal contacts 201~208 for receiving the wordline selection signals FX0A, FX2A, FX4A, FX6A, FX0B, FX2B, FX4B, and FX6B, respectively, may be disposed along one of the sides spaced apart in the Y-axis direction of the main wordline (MWLB0).

In more detail, the metal contacts 201~204, for receiving the first-group wordline selection signals FX0A, FX2A, FX4A, and FX6A or the second-group wordline selection signals FX0B, FX2B, FX4B, and FX6B, may extend in the X-axis direction and may be disposed at an edge of the respective active regions (A_P1, A_P3, A_P5, and A_P7) spaced apart from one side of the upper line M1 in the Y-axis direction. The metal contacts 205~208, for receiving the first-group wordline selection signals FX0A, FX2A, FX4A, and FX6A or the second-group wordline selection signals FX0B, FX2B, FX4B, and FX6B, may extend in the X-axis direction and may be disposed at an edge of the active regions (A_P2, A_P4, A_P6, and A_P8) spaced apart from one side of the lower line M2 in the Y-axis direction.

In addition, metal contacts 211~214 to be coupled to lines of the sub-wordline drive signals SWL0, SWL2, SWL4, and SWL6, respectively, may extend in the X-axis direction and may be disposed at an opposite edge of the active regions (A_P1, A_P3, A_P5, and A_P7) from metal contacts 201~204, and spaced apart from the upper line M1 in the Y-axis direction. The metal contacts 215~218 to be coupled to lines of the sub-wordline drive signals SWL8, SWL10, SWL12, and SWL14, respectively, may extend in the X-axis direction and may be disposed at an opposite edge of the active regions (A_P2, A_P4, A_P6, and A_P8) from metal contacts 205~208, and spaced apart from the lower line M2 in the Y-axis direction.

The metal contacts 201~204 and 215~218 may be disposed between two lines M1 and M2 in the Y-axis direction. That is, the metal contacts 201~204 and 215~218 may be disposed at the center part or gap between the two lines M1 and M1. The metal contacts 211~214 and 205~208 may be respectively disposed at the outer edge parts of the main wordline (MWLB0). That is, the metal contacts 211~214 and 205~208 may be respectively disposed at both edge parts of the two lines M1 and M2.

As described above, the first-group wordline selection signals FX0A, FX2A, FX4A, and FX6A and the second-group wordline selection signals FX0B, FX2B, FX4B, and FX6B are separated from each other and then applied to the sub-wordline driver (SWD), such that the active regions for receiving the first-group wordline selection signals FX0A, FX2A, FX4A, and FX6A and the active regions for receiving the second-group wordline selection signals FX0B, FX2B, FX4B, and FX6B can also be separated from each other.

In other words, with respect to the Y-axis direction, the active regions A_P1, A_P3, A_P5, and A_P7, in which the metal contacts 201~204 corresponding to the first-group wordline selection signals FX0A, FX2A, FX4A, and FX6A are disposed, may be separated from the other active regions A_P2, A_P4, A_P6, and A_P8 in which the metal contacts 205~208 corresponding to the second-group wordline selection signals FX0B, FX2B, FX4B, and FX6B are disposed.

For example, the active regions A_P1 and A_P2 contiguous or adjacent to each other in the Y-axis direction, from among the active regions A_P1~A_P8, may be coupled to any one of the two wordline selection signals FX0A and FX0B through the metal contacts 201 and 205. The active region A_P1 and the active region A_P2 contiguous or adjacent to each other in the Y-axis direction may be coupled to the first-group wordline selection signal FX0A and the second-group wordline selection signal FX0B, such that the active regions A_P1 and A_P2 may output different sub-wordline drive signals (i.e., the sub-wordline drive signal SWL0 and the sub-wordline drive signal SWL8). In more detail, the active region A_P1 may output the sub-wordline drive signal SWL0, or the active region A_P2 may output the sub-wordline drive signal SWL8.

Meanwhile, in the NMOS region, the active regions A_N1 and A_N2 may be spaced apart from each other by a predetermined distance in the X-axis direction. Each of the active regions A_N1 and A_N2 may each be formed in a letter "H" shape. Both active regions A_N1 and A_N2 may be formed to have the same pattern.

For example, the active region A_N1 may include active sub-regions 220~223. Active sub-regions 220 and 221, and active sub-regions 222 and 223, are spaced apart in the X-axis direction. Active sub-regions 220 and 222, and active sub-regions 221 and 223, are spaced apart in the Y-axis direction. The active sub-regions of active region A_N1 may be coupled together by another active sub-region 224, which is arranged in the center of the other four active sub-regions 220~223. Active sub-region 224 may have an "H"-like shape and be disposed between lines M1 and M2 in the NMOS region. The active region A_N2 may include active sub-regions 225~228. Active sub-regions 225 and 226, and active sub-regions 227 and 228, are spaced apart in the X-axis direction. Active sub-regions 225 and 227, and active sub-regions 226 and 228, are spaced apart in the Y-axis direction. The active sub-regions of active region A_N2 may be coupled together by another active sub-region 229, which is arranged in the center of the other four active sub-regions 225~229. Active sub-region 229 may have an "H"-like shape and be disposed between lines M1 and M2 in the NMOS region.

In the above description, active sub-regions 220~224 are described as separate elements or components, but in other embodiments contemplated by the disclosure, active sub-regions are not separated and may be integrated into a single active region. In still other embodiments, active sub-regions 220~224 may be selectively configured such that only a portion of one or more of active sub-regions 220~224 serve as an active region A_N1.

Similarly, active sub-regions 225~229 are described above as separate elements or components, but in other embodiments contemplated by the disclosure, active sub-regions are not separated and may be integrated into a single active region. In yet other embodiments, active sub-regions 225~229 may be selectively configured such that only a portion of one or more of active sub-regions 225~229 serve as an active region A_N2.

In the layout structure in FIG. 4, active regions A_N1 and A_N2 may have be arranged so that upper main wordline M1 passes over the active sub-regions 220, 221, 225 and 226, and lower main wordline M2 passes over the active sub-regions 222, 223, 227 and 228. The active sub-regions may have contacts disposed at edges on both sides of the main wordlines M1 and M2 as described below. In other embodiments, the active sub-regions may be formed in a "]" or "[" shape in which one side of the active sub-regions 220~223 or 225~228 is bent.

In the active regions A_N1 and A_N2 of the NMOS region, four selection gates 230~233 that receive the wordline drive signals FXB0, FXB2, FXB4, and FXB6 may be disposed between the lines M1 and M2 of the main wordline (MWLB0). Specifically, the selection gates 230~233 may be disposed at the portions or areas in which the active regions 220~223 and 225~228 meet or contact the active regions 224 and 229.

Each of the selection gates 230~233 may be formed in a "⊏" or reverse-"⊏" shape, such as a shape with a base and parallel legs extending perpendicularly from the ends of the base. That is, each of the selection gates 230~233 may be formed in a specific shape in which a portion of one side of a rectangular band shape is open.

In each active region A_N1 and A_N2, the legs of the selection gates 230~233 may extend perpendicularly across the legs of the "H"-like shape of active sub-regions 224 and 229. The bases are arranged outward in the X-axis direction from the center of the active sub-regions 224 and 229, and the bases parallel the legs of the "H"-like shape outside of active sub-regions 224 and 229. The ends of the legs of the selection gates 230~233 do not contact, and are spaced apart in the X-axis direction at a distance substantially similar to that between the active sub-regions in the X-axis direction described above (e.g., between active sub-regions 220 and 221, etc.). For example, the selection gate 230 and the selection gate 231 may be arranged symmetrical to each other in a horizontal direction across a Y-axis at the center of the active region A_N1. The selection gate 232 and the selection gate 233 may be arranged symmetrical to each other in a horizontal direction across a Y-axis at the center of the active region A_N2.

In the active sub-regions 220~223 and 225~228, metal contacts 241~248 to be coupled to lines of the sub-wordline drive signals SWL0/SWL8, SWL2/SWL10, SWL4/SWL12, and SWL6/SWL14 may be disposed at one side of the inner side of the main wordline (MWLB0).

For example, the metal contacts 241, 242, 243, and 244 may be respectively disposed in the active sub-regions 220, 221, 225, and 226 located between the upper line M1 and the selection gates 230~233 in the Y-axis direction. The metal contacts 245, 246, 247, and 248 may be respectively disposed in the active sub-regions 222, 223, 227, and 228 located between the lower line M2 and the selection gates 230~233 in the Y-axis direction.

In the active sub-regions 220~223 and 225~228, metal contacts 251~258 to be coupled to the back-bias voltage (VBBW) line may be disposed at one side of the outer side of the main wordline (MWLB0).

For example, the metal contacts 251, 252, 253, and 254 may be respectively disposed in the active sub-regions 220, 221, 225, and 226 located at the outside of the line M1 in the Y-axis direction. The metal contacts 255, 256, 257, and 258 may be respectively disposed in the active sub-regions 222, 223, 227, and 228 located at the outside of the line M2 in the Y-axis direction. The metal contacts 260 and 261 may be respectively disposed in the central portion of active sub-regions 224 and 229 located between the selection gates 230~233. Each of the selection gates 230~233 may be formed in a "⊏" or reverse-"⊏" shape, and the metal contacts 260 and 261 may be formed to extend between and parallel to the legs of the selection gates.

Figure 5:
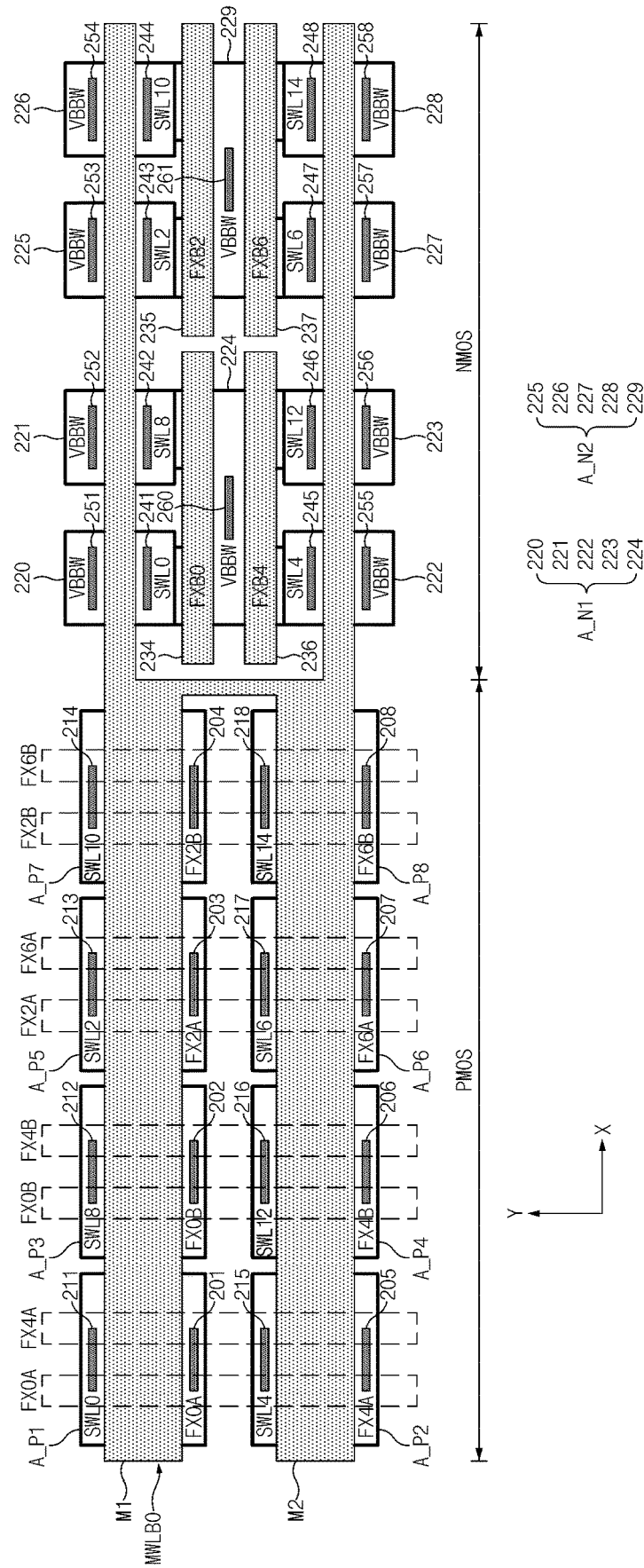
FIG. 5 is a schematic diagram illustrating another layout structure of a portion of the sub-wordline driver in FIG. 2 according to an embodiment of the disclosure.

FIG. 5 is a schematic diagram illustrating another layout structure of a portion of the sub-wordline driver (SWD) in FIG. 2 according to an embodiment of the disclosure. The sub-wordline driver (SWD) depicted in FIG. 5 will hereinafter be described using an even sub-wordline driver circuit SWD (EVEN) from FIG. 1 for convenience of description. It will be understood by those of skill in the art that an odd sub-wordline driver circuit SWD (ODD) has a substantially similar structure. Furthermore, in the following description of the sub-wordline driver (SWD) shown in FIG. 5, the same constituent elements as those of FIG. 4 will herein be omitted for convenience of description, and only the remaining constituent elements different from those of FIG. 4 will hereinafter be described with reference to FIG. 5.

As compared to FIG. 4, in FIG. 5 the arrangement of the wordline selection signals FX0A, FX2A, FX4A, FX6A, FX0B, FX2B, FX4B, and FX6B can be changed in the PMOS region. In the following description, the above-referenced wordlines will hereinafter be referred to as wordline selection signals for convenience of description. For example, pairs of wordlines spaced apart in the X-axis direction that carry wordline selection signals may be re-arranged to FX0A and FX4A; FX0B and FX4B; FX2A and FX6A; and FX2B and FX6B. Similarly, arrangement of lines in the X-axis direction to carry sub-wordline drive signals may be changed to SWL0/SWL4, SWL8/SWL12, SWL2/SWL6, and SWL10/SWL14.

In the active sub-regions 220~223 and 225~228 of the NMOS region shown in FIG. 5, arrangement of the sub-wordline drive signals SWL0/SWL8, SWL2/SWL10, SWL4/SWL12, and SWL6/SWL14 may be changed in a different way from FIG. 4. That is, the sub-wordline drive signals may be changed to an arrangement pairs SWL0/SWL4, SWL8/SWL12, SWL2/SWL6, and SWL10/SWL14, spaced apart in the X-axis direction.

In addition, in the active regions A_N1 and A_N2 of the NMOS region shown in FIG. 5, the positions and shapes of four selection gates 230~233 may be changed. That is, each of the selection gates 234~237 may be formed in a bar shape that traverses the center part of each active region A_N1 and A_N2.

For example, the selection gate 234 and the selection gate 236 may be formed to traverse the active region A_N1 by extending in the X-axis direction and substantially perpendicular to the legs of the "H"-like shape of active sub-regions 224 and 229. The selection gate 234 may be disposed to pass over the spacing between the metal contact 260 and the metal contacts 241 and 242, and the selection gate 236 may be disposed to pass over the spacing between the metal contact 260 and the metal contacts 245 and 246.

Each of the selection gate 235 and the selection gate 237 may extend in the X-axis direction and traverse the active region A_N2. That is, the selection gate 235 may be disposed to traverse the spacing between the metal contact 261 and the metal contacts 243 and 244, and the selection gate 237 may be disposed to traverse the spacing between the metal contact 261 and the metal contacts 247 and 248.

Figure 6:
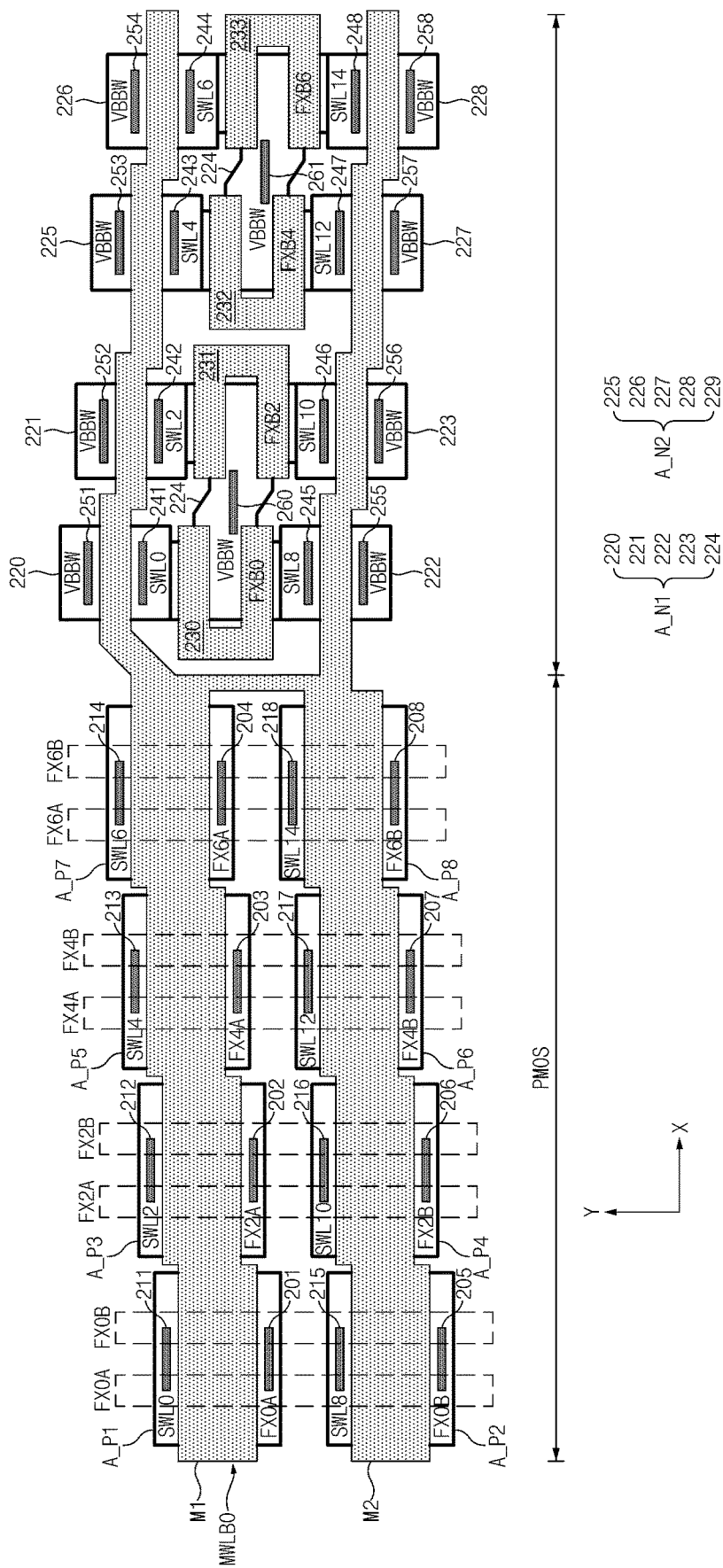
FIG. 6 is a schematic diagram illustrating still another layout structure of a sub-wordline driver in FIG. 2 according to an embodiment of the disclosure.

FIG. 6 is a schematic diagram illustrating still another layout structure of a portion of the sub-wordline driver (SWD) in FIG. 2 according to an embodiment of the disclosure. The sub-wordline driver (SWD) depicted in FIG. 6 will hereinafter be described using an even sub-wordline driver circuit SWD (EVEN) from FIG. 1 for convenience of description. It will be understood by those of skill in the art that an odd sub-wordline driver circuit SWD (ODD) has a substantially similar structure. Furthermore, in the following description of the sub-wordline driver (SWD) shown in FIG. 6, the same constituent elements as those of FIG. 4 will herein be omitted for convenience of description, and only the remaining constituent elements different from those of FIG. 4 will hereinafter be described with reference to FIG. 6.

Referring to FIG. 6, the sub-wordline driver (SWD) may be configured in a manner that the respective transistors are disposed in a stepped shape. That is, the sub-wordline driver (SWD) may be configured in a manner that lines of the main wordline (MWLB0) are shifted by a predetermined distance without being formed in a single line shape.

For example, in each of the PMOS region and the NMOS region of the sub-wordline driver (SWD), lines of the main wordline (MWLB0) may be formed in a stepped shape. In more detail, in the PMOS region, lines of the main wordline (MWLB0) may be formed in a stepped shape that gradually ascends in the Y-axis direction in proportion to the increasing X-directional extension length of the main wordline (MWLB0). In addition, in the NMOS region, lines of the main wordline (MWLB0) may be formed in a stepped shape that gradually descends in the Y-axis direction in proportion to the increasing X-directional extension length of the main wordline (MWLB0).

If lines of the main wordline (MWLB0) in the sub-wordline driver (SWD) are shifted, not only metal contacts coupled to the main wordline (MWLB0), but also active regions coupled to the main wordline (MWLB0) may also be shifted by a predetermined distance.

Figure 7:
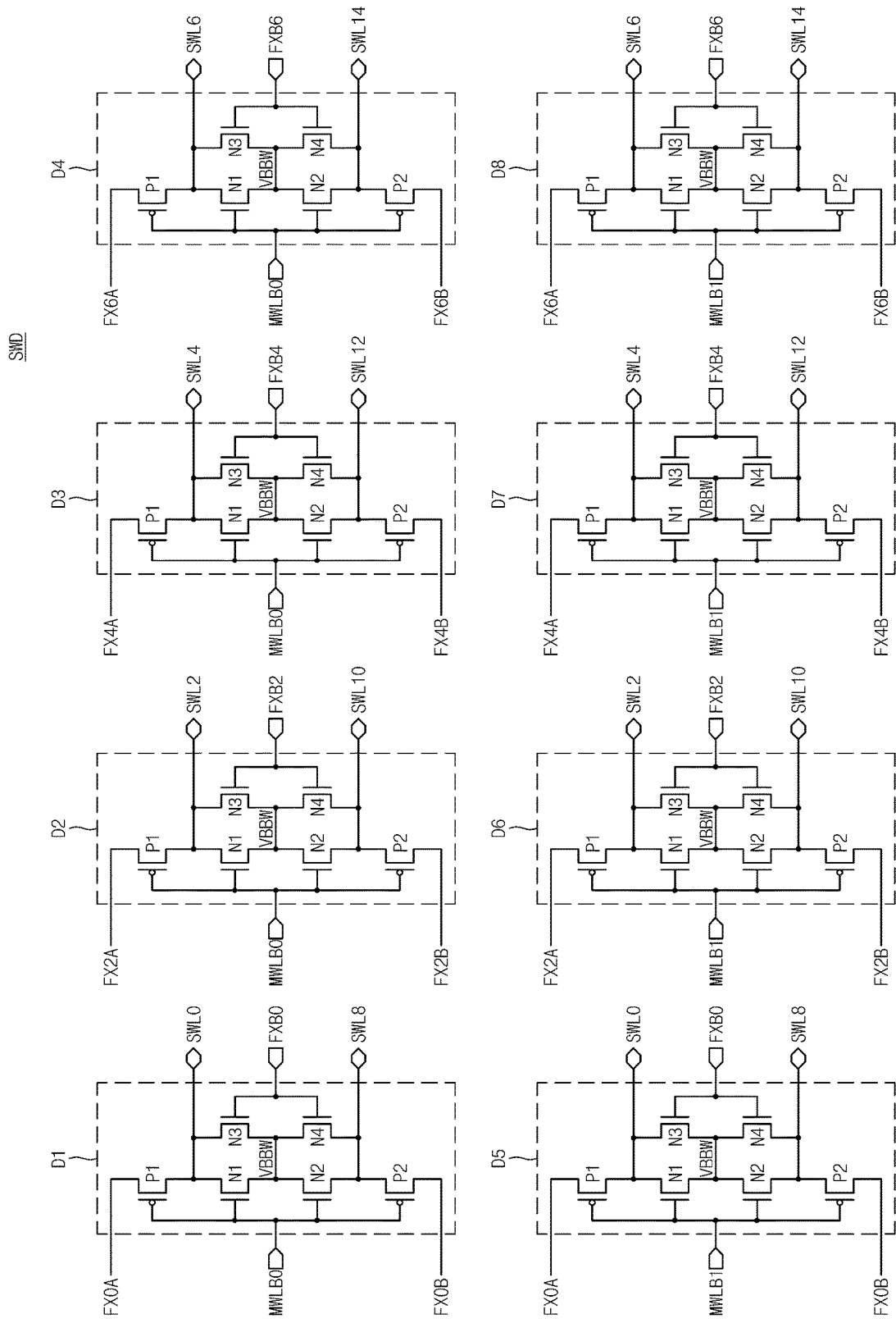
FIG. 7 illustrates an example of a sub-wordline driver of FIG. 2 according to an embodiment of the disclosure.

FIG. 7 illustrates an example of the sub-wordline driver (SWD) in FIG. 2 according to an embodiment of the disclosure. The sub-wordline driver (SWD) depicted in FIG. 7 will hereinafter be described using an even sub-wordline driver circuit SWD (EVEN) from FIG. 1 for convenience of description. It will be understood by those of skill in the art that an odd sub-wordline driver circuit SWD (ODD) has a substantially similar structure. Furthermore, in the following description of the circuit diagram shown in FIG. 7, the same constituent elements as those of FIG. 4 will herein be omitted for convenience of description, and only the remaining constituent elements different from those of FIG. 4 will hereinafter be described with reference to FIG. 7. In addition, the circuit diagram shown in FIG. 7 does not illustrate the selection controller 100 for convenience of description.

The sub-wordline driver (SWD) shown in FIG. 7 may include eight driving circuits D1~D8. Each of four driving circuits D1~D4 from among the eight driving circuits D1~D8 may receive the main wordline drive signal (MWLB0). Each of four driving circuits D5~D8 from among the eight driving circuits D1~D8 may receive the main wordline drive signal (MWLB1).

The sub-wordline driver (SWD) may enable the driving circuits D1~D4 to output the sub-wordline drive signals SWL0, SWL2, SWL4, SWL6, SWL8, SWL10, SWL12, and SWL14 in response to the main wordline (MWLB0), or may enable the drivers D5~D8 to output the sub-wordline drive signals SWL0, SWL2, SWL4, SWL6, SWL8, SWL10, SWL12, and SWL14 in response to the other main wordline (MWLB1).

Figure 8:
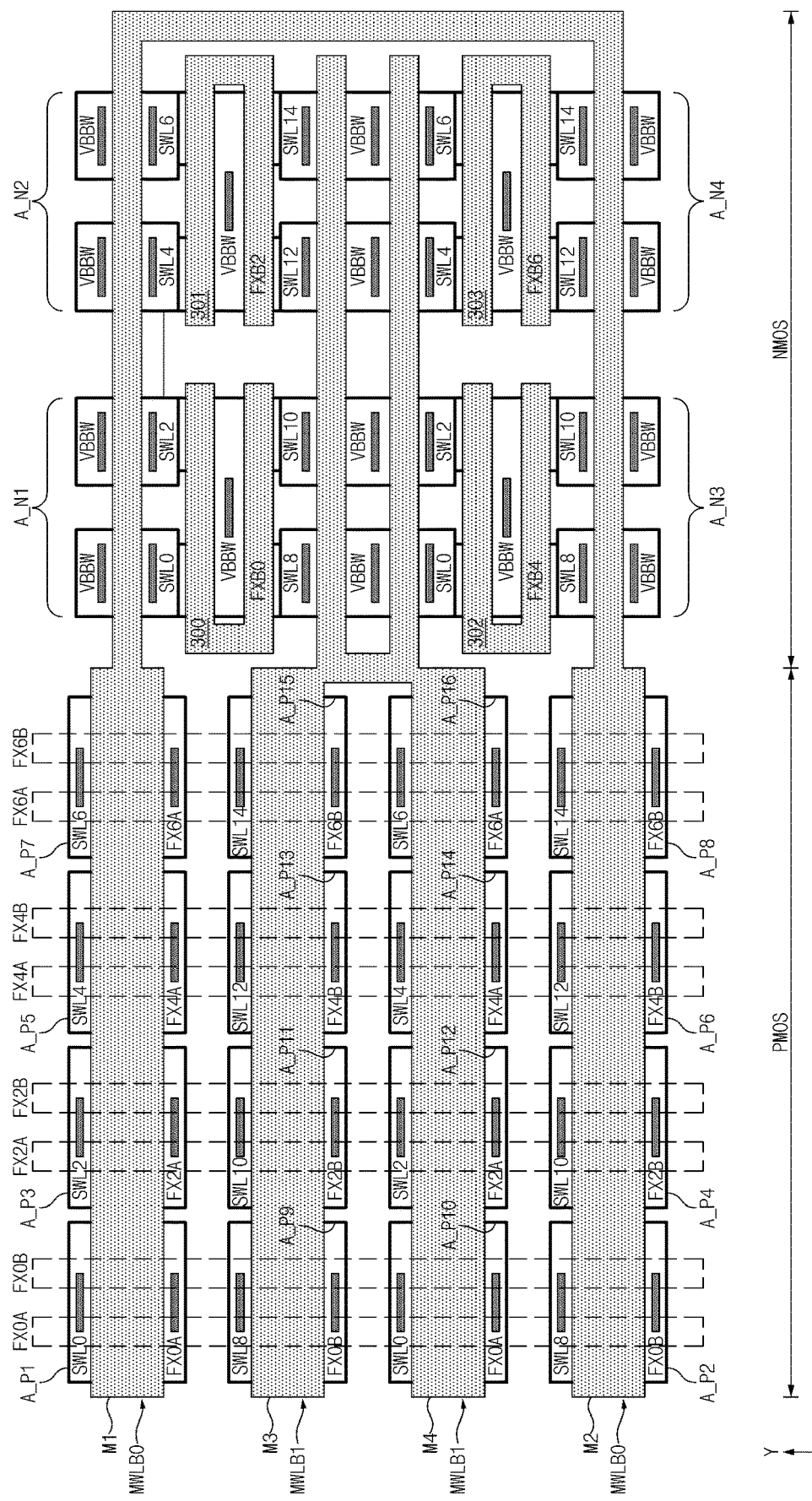
FIG. 8 is a schematic diagram illustrating a layout structure of the sub-wordline driver in FIG. 7 according to an embodiment of the disclosure.

FIG. 8 is a schematic diagram illustrating a layout structure of the sub-wordline driver (SWD) in FIG. 7 according to an embodiment of the disclosure. In the following description of the circuit diagram shown in FIG. 8, the same constituent elements as those of FIG. 4 will herein be omitted for convenience of description, and only the remaining constituent elements different from those of FIG. 4 will hereinafter be described with reference to FIG. 8.

Referring to FIG. 8, a plurality of active regions A_P1~A_P16 may be disposed in the PMOS region, and a plurality of active regions A_N1~A_N4 may be disposed in the NMOS region. The active regions A_P1~A_P16 of the PMOS region may be spaced apart from each other by a predetermined distance not only in the X-axis direction, but also in the Y-axis direction.

Lines of the main wordline drive signals MWLB0 and MWLB1 extending in the X-axis direction may be disposed over the active regions A_P1~A_P16 of the PMOS region and the active regions A_N1~A_N4 of the NMOS region. In the following description, lines of the main wordline drive signals MWLB0 and MWLB1 will hereinafter be referred to as main wordlines MWLB0 and MWLB1 for convenience of description.

The main wordline (MWLB0) may be divided into two lines M1 and M2, and the two lines M1 and M2 may extend in the X-axis direction from the PMOS region, such that the resultant two lines M1 and M2 may be coupled to each other in the Y-axis direction through connection lines at the end of the NMOS region. The main wordline (MWLB1) may be divided into two lines M3 and M4, and the two lines M3 and M4 may extend in the X-axis direction, such that the resultant two lines M3 and M4 may be coupled to each other in the Y-axis direction in the area or region between the PMOS region and the NMOS region.

In the PMOS region, the main wordline (MWLB0) may be divided into two lines M1 and M2, and the two lines M1 and M2 may be spaced apart from each other by a predetermined distance in the Y-axis direction. The main wordline (MWLB1) may be divided into two lines M3 and M4, such that the two lines M3 and M4 may be spaced apart from each other by a predetermined distance in the Y-axis direction. The lines M3 and M4 of the main wordline (MWLB1) may be disposed between the two lines M1 and M2.

The line M1 of the main wordline (MWLB0) may be disposed over the active regions A_P1, A_P3, A_P5, and A_P7 from among the active regions A_P1~A_P16. The line M2 of the main wordline (MWLB0) may be disposed over the active regions A_P2, A_P4, A_P6, and A_P8 from among the active regions A_P1~A_P16. In addition, the line M3 of the main wordline (MWLB1) may be disposed over the active regions A_P9, A_P11, A_P13, and A_P15 from among the active regions A_P1~A_P16. The line M4 of the main wordline (MWLB1) may be disposed over the active regions A_P10, A_P12, A_P14, and A_P16 from among the active regions A_P1~A_P16.

The sub-wordline driver (SWD) may output the sub-wordline drive signals SWL0, SWL2, SWL4, SWL6, SWL8, SWL10, SWL12, and SWL14 in response to the main wordline (MWLB0), or may output the sub-wordline drive signals SWL0, SWL2, SWL4, SWL6, SWL8, SWL10, SWL12, and SWL14 in response to the main wordline (MWLB1).

In the NMOS region, the active regions A_N1~A_N4 may be configured in a manner such that the active regions A_N1 and A_N2 shown in FIG. 4 are repeated and arranged or transformed in the Y-axis direction. The active regions A_N1~A_N4 may be formed to have the same pattern. The active regions A_N1 and A_N2 and the active regions A_N3 and A_N4 may be arranged symmetrical to each other across an axis in the X-axis direction. The active regions A_N1, A_N3 and the active regions A_N2, A_N4 may be spaced apart from each other by a predetermined distance in the X-axis direction.

The active regions A_N1 and A_N2 may be formed by sub-active regions into a letter "H"-like shape, with each active region having a central sub-active region that couples the sub-active regions together. The active regions A_N1 and A_N3 may be disposed or transformed along the same reference line in the Y-axis direction. The active regions A_N2 and A_N4 may be disposed or transformed along the same reference line in the Y-axis direction.

In the active regions A_N1 and A_N2 of the NMOS region, two selection gates 300 and 301 for receiving the wordline drive signals FXB0 and FXB2 may be disposed between the lines M1 and M3. In the active regions A_N3 and A_N4, two selection gates 302 and 303 for receiving the wordline drive signals FXB4 and FXB6 may be disposed between the lines M4 and M2.

For example, the selection gate 300 and the selection gate 301 may be arranged symmetrical to each other in a horizontal direction across an axis in the Y-axis direction. The selection gate 300 and the selection gate 301 may each be formed in a "⊏" or reverse-"⊏" shaped structure, such as a structure with a base and parallel legs extending perpendicularly from the ends of the base. The selection gate 302 and the selection gate 303 may be arranged symmetrical to each other in a horizontal direction across an axis in the Y-axis direction. The selection gate 302 and the selection gate 303 may each in a "⊏" or reverse-"⊏" shaped structure, such as a structure with a base and parallel legs extending perpendicularly from the ends of the base. That is, each of the selection gates 300~303 may be formed in a specific shape in which a portion of one side of a rectangular band shape is open. In each active region A_N1 and A_N2, the legs of the selection gates 300 and 301 may extend perpendicularly across the legs of the "H"-like shape of the active regions. The ends of the legs of the selection gates 300 and 301 do not contact, and are spaced apart in the X-axis direction at a distance substantially similar to that between the active regions A_N1 and A_N2 in the X-axis direction. The bases of the selection gates 300 and 301 are arranged outward in the X-axis direction from the area between the active regions A_N1 and A_N2. The selection gates 302 and 303 are arranged in a similar manner with respect to active regions A_N3 and A_N4.

As is apparent from the above description, a sub-wordline driver according to embodiments of the disclosed technology is configured in a manner such that the region occupied by the sub-wordline driver can be minimized in size.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, those skilled in the art will understand that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A sub-wordline driver comprising:
   a plurality of first active regions, spaced apart from each other by a predetermined distance in each of a first direction and a second direction within a first region, and physically separated from each other; and
   a continuous main wordline formed to traverse the plurality of first active regions by extending in the first direction,
   wherein the main wordline includes:
   a first line formed to extend in the first direction;
   a second line formed to extend in the first direction, and configured to be spaced apart from the first line by a predetermined distance in the second direction; and
   a connection line configured to interconnect the first line and the second line in the second direction at an end portion of the first region.

2. The sub-wordline driver according to claim 1, wherein each of the first active regions includes:
   a first metal contact formed at one side of the main wordline and arranged in the second direction, and configured to receive a first-group wordline selection signal or a second-group wordline selection signal; and
   a second metal contact formed at the other side of the main wordline and arranged in the second direction, and coupled to lines of a sub-wordline drive signal.

3. The sub-wordline driver according to claim 1, wherein:
   active regions contiguous to each other in the second direction, from among the plurality of first active regions, are configured in a manner that a metal contact coupled to a first-group wordline selection signal and a metal contact coupled to a second-group wordline selection signal are separated from each other and coupled to lines of different sub-wordline drive signals.

4. The sub-wordline driver according to claim 1, wherein each of the plurality of first active regions is formed in a rectangular shape.

5. The sub-wordline driver according to claim 1, further comprising:
   a plurality of second active regions disposed in a second region contiguous to the first region in the first direction, and configured to allow the main wordline to extend in the first direction over the second active regions.

6. The sub-wordline driver according to claim 5, wherein the plurality of second active regions is formed in a letter "H" shape.

7. The sub-wordline driver according to claim 5, wherein the first line and second line of the main wordline are formed to enable a line width arranged in the second direction within the first region to be different from a line width arranged in the second direction within the second region.

8. The sub-wordline driver according to claim 5, further comprising:
   a plurality of selection gates disposed between the first line and the second line in the second region, and configured to receive a plurality of wordline drive signals.

9. The sub-wordline driver according to claim 8, wherein two selection gates contiguous to each other in the first direction are formed to face each other in a "⊏" or reverse-"⊏" shape.

10. The sub-wordline driver according to claim 8, wherein the plurality of selection gates is formed in a bar shape in which two selection gates contiguous to each other in the second direction are formed to traverse the plurality of second active regions in the first direction.

11. The sub-wordline driver according to claim 8, wherein each of the plurality of second active regions includes:
    a third metal contact, formed at an upper or lower side of the main wordline in the second direction and coupled to a line of a back-bias voltage;
    a fourth metal contact disposed between the main wordline and the plurality of selection gates in the second direction and coupled to a line of a sub-wordline drive signal; and
    a fifth metal contact disposed in each second active region between the plurality of selection gates.

12. The sub-wordline driver according to claim 1, wherein the lines of the main wordline are disposed in a stepped shape.

13. A sub-wordline driver comprising:
    a plurality of first and second active regions, spaced apart from each other by a predetermined distance in each of a first direction and a second direction within a first region, and physically separated from each other;
    a plurality of third and fourth active regions, spaced apart from each other by a predetermined distance in each of the first direction and the second direction within a second region contiguous to the first region, and physically separated from each other;
    a continuous first main wordline formed to extend in the first direction, and configured to traverse the plurality of first active regions and the plurality of third active regions; and
    a continuous second main wordline formed to extend in the first direction, and configured to traverse the plurality of second active regions and the plurality of fourth active regions,
    wherein each of the first main wordline and the second main wordline includes:
    a first line formed to extend in the first direction; and
    a second line formed to extend in the first direction, and configured to be spaced apart from the first line by a predetermined distance in the second direction;
    wherein a connection line is configured to interconnect the first line and the second line of the first main wordline in the second direction at an end portion of the second region, and
    wherein the connection line is configured to interconnect the first line and the second line of the second main wordline in the second direction at an end portion of the first region.

14. The sub-wordline driver according to claim 13, wherein each of the plurality of first and second active regions includes:
    a first metal contact formed at one side of the first or second main wordline and arranged in the second direction, and configured to receive a first-group wordline selection signal or a second-group wordline selection signal; and a second metal contact formed at the other side of the first or second main wordline and arranged in the second direction, and coupled to lines of a sub-wordline drive signal.

\* \* \* \* \*